United States Patent
Ikeda et al.

(10) Patent No.: US 12,380,933 B2
(45) Date of Patent: Aug. 5, 2025

(54) PSEUDO-STATIC RANDOM ACCESS MEMORY

(71) Applicant: Winbond Electronics Corp., Taichung (TW)

(72) Inventors: Hitoshi Ikeda, Yokohama (JP); Takahiko Sato, Yokohama (JP)

(73) Assignee: WINDBOND ELECTRONICS CORP., Taichung (TW)

(*) Notice: Subject to any disclaimer, the term of this patent is extended or adjusted under 35 U.S.C. 154(b) by 458 days.

(21) Appl. No.: 17/960,433

(22) Filed: Oct. 5, 2022

(65) Prior Publication Data

US 2023/0143405 A1  May 11, 2023

(30) Foreign Application Priority Data

Nov. 8, 2021  (JP) .................................. 2021-181689

(51) Int. Cl.
    *G11C 7/10* (2006.01)
(52) U.S. Cl.
    CPC .......... *G11C 7/1093* (2013.01); *G11C 7/1048* (2013.01); *G11C 7/1063* (2013.01)
(58) Field of Classification Search
    CPC ............................... G11C 7/1093; G11C 7/10
    USPC ...................................................... 365/233.1
    See application file for complete search history.

(56) References Cited

U.S. PATENT DOCUMENTS

| | | | | |
|---|---|---|---|---|
| 7,301,842 B2* | 11/2007 | Lee | ................... | G11C 11/40615 365/222 |
| 8,112,266 B2* | 2/2012 | Rajan | ...................... | G11C 7/10 703/24 |
| 8,917,568 B2* | 12/2014 | Chen | ................... | G11C 11/4063 365/194 |
| 10,013,371 B2 | 7/2018 | Rajan et al. | | |
| 2003/0229750 A1* | 12/2003 | Higuchi | ............... | G11C 7/1018 711/218 |
| 2005/0169091 A1* | 8/2005 | Miki | ................. | G11C 11/40615 365/230.03 |
| 2009/0175115 A1* | 7/2009 | Bilger | ...................... | G11C 8/18 365/233.5 |

(Continued)

FOREIGN PATENT DOCUMENTS

| | | |
|---|---|---|
| CN | 102237128 A | 11/2011 |
| JP | 8-255107 A | 10/1996 |
| JP | 2003-15949 A | 1/2003 |

(Continued)

OTHER PUBLICATIONS

Japanese Notification of Reasons for Refusal for Japanese Application No. 2021-181689 dated, Oct. 4, 2022, with English translation.

*Primary Examiner* — Muna A Techane
(74) *Attorney, Agent, or Firm* — Birch, Stewart, Kolasch & Birch, LLP (57) ABSTRACT

A pseudo-static random access memory is provided herein, which may improve the speed of data transmission. After a first delay from a command and a row address being input in a first operation, the pseudo-static random access memory inputs or outputs the data in the memory cells corresponding to the input row address and the input column address, which includes a control unit controlling a delay in the second operation less than the initial delay when a specific condition is satisfied. The second operation is executed after the first operation.

12 Claims, 9 Drawing Sheets

(56) References Cited

U.S. PATENT DOCUMENTS

2016/0071568 A1 3/2016 Sakai et al.
2021/0357335 A1* 11/2021 Park ................... G06F 13/1605

FOREIGN PATENT DOCUMENTS

| JP | 2004-13618 A | 1/2004 |
| JP | 2005-222581 A | 8/2005 |
| JP | 2020-194613 A | 12/2020 |
| TW | 201407610 A | 2/2014 |
| TW | I467381 B | 1/2015 |

* cited by examiner

| tCK | inital delay | short delay |
|---|---|---|
| 10 ns | 4 clk | 2 clk |
| 7.5 ns | 5 clk | 2 clk |
| 6 ns | 6 clk | 3 clk |
| 5 ns | 7 clk | 3 clk |
| 4 ns | 9 clk | 4 clk |

FIG. 3

| Rising edge of 1stCLK | ADQ7 | ADQ6 | ADQ5 |
|---|---|---|---|
| read command with precharge | 1 | 0 | 0 |
| read command without precharge | 1 | 0 | 1 |
| write command with precharge | 0 | 0 | 0 |
| write command without precharge | 0 | 0 | 1 |

| Rising edge of 1stCLK | ADQ7 | ADQ6 | ADQ4 |
|---|---|---|---|
| memory read | 1 | 0 | 0 |
| memory write | 0 | 0 | 0 |
| register read | 1 | 1 | 0 |
| register write | 0 | 1 | 0 |
| precharge | x | x | 1 |

PSEUDO-STATIC RANDOM ACCESS MEMORY

CROSS REFERENCE TO RELATED APPLICATIONS

This Application claims priority of Japan Patent Application No. 2021-181689, filed on Nov. 8, 2021, the entirety of which is incorporated by reference herein.

BACKGROUND OF THE INVENTION

Field of the Invention

The disclosure is generally related to a pseudo-Static Random Access Memory (pSRAM).

Description of the Related Art pSRAM is a semiconductor memory device that includes an interface compatible with a static random access memory (SRAM) (e.g., Patent Document 1: Japanese Patent No. JP2020-135914B2).

Figure 1A:
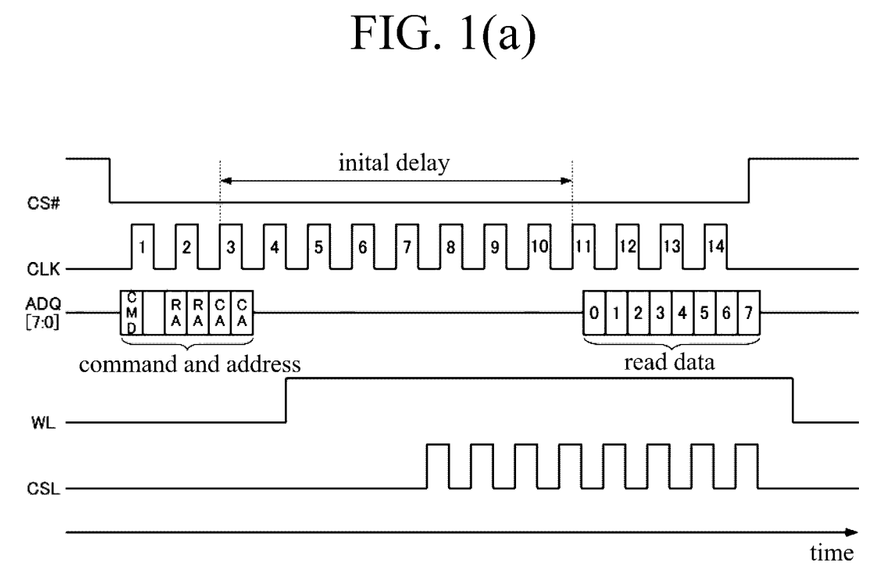
FIG. 1(a) is a timing chart illustrating an example of the timing of a signal in a conventional pSRAM when a read command is input.
Figure 1B:
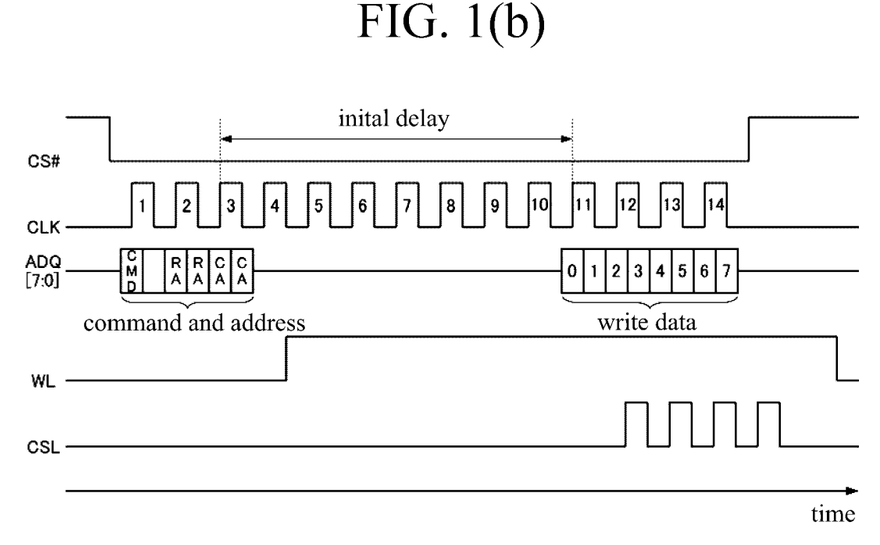
FIG. 1(b) is a time chart illustrating the timing of signals in a conventional pSRAM when a write command is input.

FIG. 1(a) is a timing chart illustrating an example of the timing of a signal in a conventional pSRAM when a read command is input. FIG. 1(b) is a time chart showing the timing of signals in a conventional pSRAM when a write command is input. The pSRAM is illustrated herein as a clock-synchronized pSRAM that receives signals in synchronization with the clock signal, and also illustrated as an example that a pSRAM of the address data multiplexing interface type. The pSRAM of the address data multiplex interface type has address data terminals configured to input each address signal and the corresponding data signal. The pSRAM is configured to start a read or write operation when the chip select signal CS #transitions from inactive (high level) to active (low level), and to complete the read or write operation to precharge when the chip select signal CS #transitions from active (low level) to inactive (high level).

The chip selection signal CS #is synchronized with each of the first to third clocks of the external clock signal CLK transitioning from inactive (high level) to active (low level), via the address data terminal Enter the command (CMD), column address (RA), and row address (CA). Specifically, the command (CMD) is input at the rising edge of the first clock of the external clock signal CLK, the row address (RA) is input at the rising and falling edges of the second clock of the external clock signal CLK, and are the column address (CA) is input at the rising edge and falling edge of the third clock of the external clock signal CLK. In addition, the case where an 8-bit signal is input at each clock edge is shown as an example.

In FIG. 1(a), the word line (WL) becomes active (high level) after the row address is input, and the column select line (CSL) is transitioned after the column address (CA) is input. Next, after an initial delay from the input command (CMD) and the row address (RA), the data in the memory cells corresponding to the input row address (RA) and column address (CA) are read and output as data. In addition, the word line (WL) is precharged when the chip select signal CS #transitions from active (low level) to inactive (high level). The initial delay is expressed as tCK (tCK display clock cycle)×delay number N (N is an integer greater than or equal to 1, which is the display delay number), and the case where the delay number is 8 (N=8) is shown as an example. In addition, the number of delays depends on the frequency of the external clock signal CLK, and the higher the frequency of the external clock signal CLK, the greater the delay number.

In FIG. 1(b), the word line (WL) becomes active (high level) after the row address is input. Next, when the write data is input after an initial delay from the input command (CMD) and the row address (RA), the column select line (CSL) is transitioned. The length of the initial delay in the write operation is equal to the length of the initial delay in the read operation. In addition, the word line (WL) is precharged when the chip select signal CS #transitions from active (low level) to inactive (high level).

Since it is impossible to input or output reading or writing data and the time of each operation cannot be shortened until the initial delay in each operation has passed, there is a difficulty that the data transmission speed cannot be improved.

BRIEF SUMMARY OF THE INVENTION

The present invention provides a pseudo-static random access memory. In the first operation, after an initial delay from a command and a row address being input, data in the memory cells corresponding to the inputted row address and a column address are input or output. The pseudo-static random access memory includes a control unit controlling the delay in the second operation less than the initial delay when a specific condition is satisfied. The second operation is executed after the first operation.

Based on the pseudo-static random access memory of the present invention, the speed of data transmission may be improved.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

This description is made for the purpose of illustrating the general principles of the invention and should not be taken in a limiting sense. In addition, the present disclosure may repeat reference numerals and/or letters in the various examples. This repetition is for the purpose of simplicity and clarity and does not in itself dictate a relationship between the various embodiments and/or configurations discussed. The scope of the invention is best determined by reference to the appended claims.

It would be understood that, in the description herein and throughout the claims that follow, although the terms "first," "second," etc. may be used to describe various elements, these elements should not be limited by these terms. These terms are only used to distinguish one element from another. For example, a first element could be termed a second element, and, similarly, a second element could be termed a first element, without departing from the scope of the embodiments.

It is understood that the following disclosure provides many different embodiments, or examples, for implementing different features of the application. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact.

First Embodiment

Figure 2:
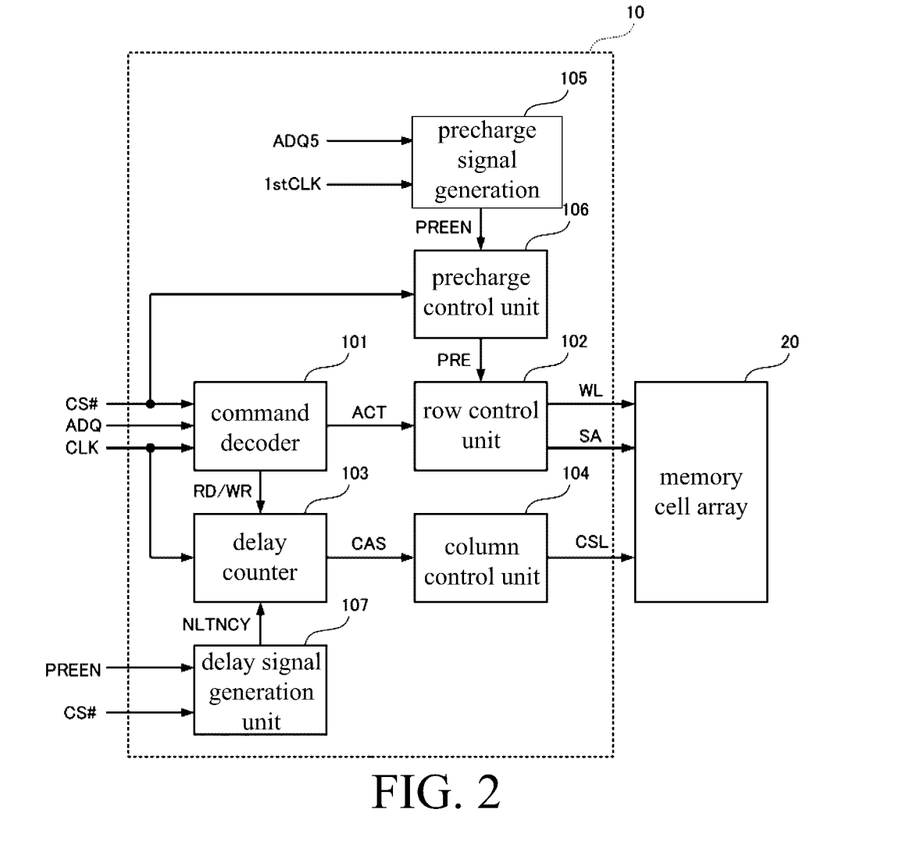
FIG. 2 is a block diagram illustrating a configuration example of a pSRAM in accordance with a first embodiment of the present invention.

FIG. 2 is a block diagram illustrating a configuration example of a pSRAM in accordance with a first embodiment of the present invention. The pSRAM of this embodiment is operated in the first operation. After an initial delay from the input of the command and the row address, data is input or output to/from the memory cell corresponding to the inputted row address and column address. The pSRAM of this embodiment includes a control unit 10 and a memory cell array 20. The control unit 10 and the memory cell array 20 may each be constituted by a dedicated hardware device or logic circuit. The memory cell array 20 includes a plurality of memory cells arranged in rows and columns.

When a specific condition is satisfied, the control unit 10 controls the delay in the second operation posterior to the first operation to be less than the aforementioned initial delay. In this embodiment, the specific condition includes inputting a specific command in the first operation, and the specific command is configured to make the delay in the second operation less than the initial delay. In this embodiment, the specific command includes a command for instructing not to precharge the word line corresponding to the input row address. In this embodiment, the specific command includes a read command and a write command.

The pSRAM in this embodiment is a pseudo-static random access memory that the input signal or the output signal is synchronized with a clock signal (e.g., an external clock signal CLK). Since the command signal, the address signal, and the data signal are input or output synchronously with the clock signal (external clock signal CLK), the length of the delay from the input of the command signal and the address signal to the input or the output of the data signal may be set according to the number of clock cycles.

The pSRAM of the embodiment is a pseudo-static random access memory of the address data multiplex interface type, which has an address data terminal configured to input each address signal and a data signal. Since each address signal and data signal are not input through an independent terminal but through a common terminal (the address data terminal), the commands, addresses, and data for other operations are not input during operation. The delay control may be suppressed according to operations other than the first operation and/or the second operation that are input.

The control unit 10 includes an instruction decoder 101, a row control unit 102, a delay counter 103, a column control unit 104, a precharge signal generation unit 105, a precharge control unit 106, and a delay signal generation unit 107.

Figure 6A:
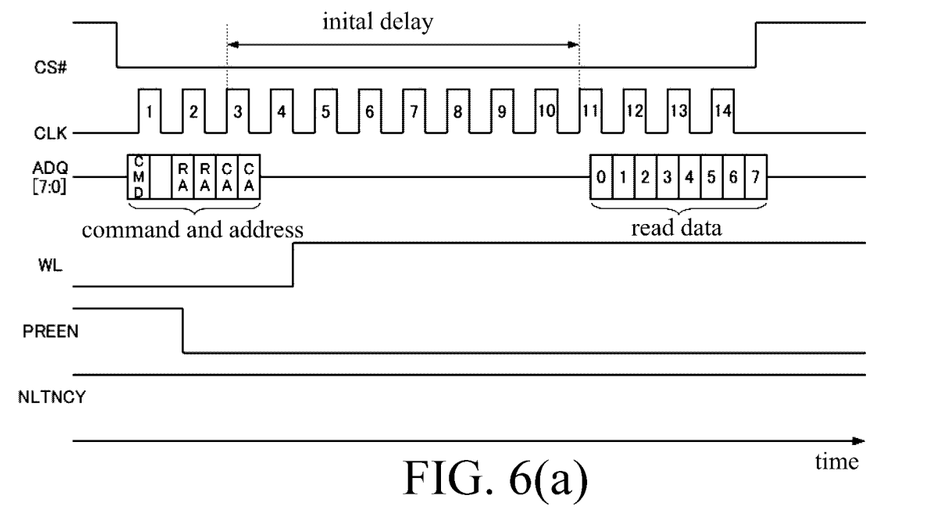
FIG. 6(a) is a timing chart illustrating an example of the timing of the signals in the pSRAM in the state where the initial delay is set when a read command is input.

When the chip selection signal CS #input externally changes from inactive (high level) to active (low level), the command decoder 101 is synchronized with the external clock signal CLK to decode the command input through the address data terminal CMD (as shown in FIG. 6(a)) so as to generate internal commands. The generated internal commands include, for example, the activation signal ACT, the read signal RD, the write signal WR, and so on. Although it is not shown in FIG. 2, the command decoder 101 generates update signals and the like as the internal commands.

The row control unit 102 controls the activation/deactivation of the corresponding memory cells in the memory cell array 20 according to the activation signal ACT input from the command decoder 101. For example, when the active (high-level) activation signal ACT is input from the command decoder 101, the row control unit 102 utilizes the row address RA (as shown in FIG. 6(a)) input through the address data terminal to activate the signal WL corresponding word line to be active (high level), and outputs the signal WL to the memory cell array 20. In addition, when the activation signal ACT, which is active (high level), is input from the command decoder 101, the row control unit 102 activates the sense amplifier signal SA, and outputs the sense amplifier signal SA to the memory cell array 20.

When the precharge signal PRE, which is active (high level), is input from the precharge control unit 106, the row control unit 102 deactivates the signal WL (low level) and outputs the signal WL to the memory cell array 20 after the operation (the chip select signal CS #is changed from active (low level) to inactive (high level)). Therefore, the activated word line is deactivated after the operation is completed, and the precharge operation of the word line is performed. On the other hand, when the inactive (low level) precharge signal PRE is input from the precharge control unit 106, the row control unit 102 also outputs the signal WL, which is active (high level), to the word line of the memory cell array 20 after the operation is completed. The active state of the word line is also maintained without precharging the word line.

The delay counter 103 counts the number of pulses (the number of toggles) of the external clock signal CLK input externally when the read signal RD or the write signal WR is input from the command decoder 101. Then, when the number of pulses counted by the delay counter 103 reaches a specific delay value, the signal CAS input through the address data terminal is output to the column control unit 104, and the signal CAS is used to designate the input column address CA (shown in FIG. 6(*a*)).

The delay counter 103 is configured to set the counted delay value according to the signal NLTNCY input from the delay signal generation unit 107. For example, when the signal NLTNCY is active (high level), the delay counter 103 determines that the delay is an initial delay, and sets the counted delay value as a value corresponding to the initial delay. In addition, when the signal NLTNCY is inactive (low level), the delay counter 103 determines that the delay is a delay less than the initial delay, and sets the counted delay value to a value corresponding to the short delay (a value smaller than the value corresponding to the initial delay).

Figure 3:
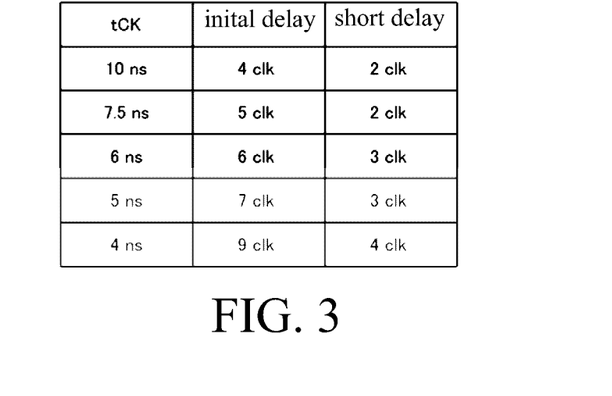
FIG. 3 is a schematic diagram illustrating an example of the relationship between the initial delay and short latency for each different clock cycle.

An example of the relationship between the value corresponding to the initial delay and the value corresponding to the short delay is shown in FIG. 3, and the value corresponding to the initial delay and the value corresponding to the short delay are set at each clock cycle (tCK). In addition, in each clock cycle, the value of the initial delay (the number of clock cycles of the external clock signal CLK) is set to be a value larger than the value of the short delay (the number of the clock cycles of the external clock signal CLK). Furthermore, the value corresponding to the initial delay and the value corresponding to the short delay are set to be larger as the clock period is less (the frequency of the external clock signal CLK is higher). In addition, information showing such a relationship may be stored in a mode register or the like as the information of the operation mode of the pSRAM (e.g., burst length, etc.), and referenced by the delay counter 103.

In addition, when the delay counter 103 has an initial delay (when the signal NLTNCY is active (high level)), the external clock starts counting the number of pulses of the clock from that the command CMD and the row address RA are input (the third clock in the example shown in FIG. 6(*a*)). Furthermore, when the delay counter 103 has a short delay (when the signal NLTNCY is inactive (low level)), the external clock starts counting the number of pulses of the clock from that the command CMD and the column address CA are input (the fourth clock in the example shown in FIG. 6(*a*)).

When the signal CAS is input from the delay counter 103, the column control unit 104 activates the signal of the column select line corresponding to the column address CA designated by the signal CAS to be active (make it active) and outputs the signal of the column select line to the memory cell array 20.

The precharge signal generation unit 105, according to the command CMD input through the address data terminal, generates a precharge enable signal PREEN indicating whether to precharge the word line corresponding to the row address RA input through the address data terminal, and outputs the precharge enable signal PREEN to the precharge control unit 106. Specifically, when the precharge signal generating section 105 is at the first external clock signal CLK in the operation (shown as 1stCLK in FIG. 6(*a*)) and the value of ADQ5 bits of the 8-bit signals ADQ[7:0] is inputted at the rising edge of the first external clock signal CLK, a precharge enable signal PREEN is generated and provided to the precharge control unit 106.

Figure 4:
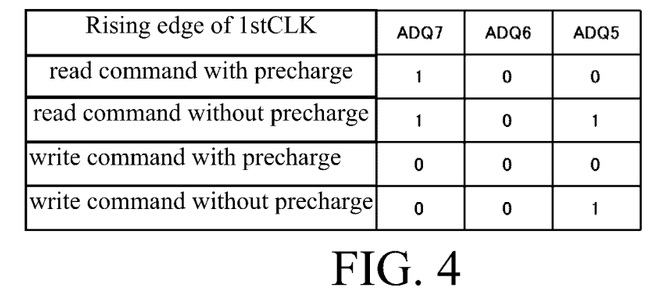
FIG. 4 is a schematic diagram illustrating an example of bit allocation of a display instruction.

FIG. 4 is a schematic diagram illustrating an example of the bit allocation of the command CMD. The command CMD consists of 3 bits of ADQ7 bits, ADQ6 bits, and ADQ5 bits among the 8-bit signals ADQ[7:0] inputted at the rising edge of the first external clock signal CLK during operation. The ADQ7 bit is a bit used to specify the command type (read command or write command). When the value of ADQ7 is 1, the command CMD is a read command. When the value of ADQ7 is 0, the command CMD is a write command. ADQ6 is configured to specify the processing object (a memory cell or a register) of the command. When the value of ADQ6 is 1, the command is performed on a register. When the value of ADQ6 is 0, the command is performed on a memory cell. ADQ5 is configured to indicate whether to precharge the word line corresponding to the row address RA input through the address data terminal. When the value of ADQ5 is 1, the command CMD instructs not to precharge the word line, and when the value of ADQ5 is 0, the command CMD instructs to precharge the word line.

Figure 5A:
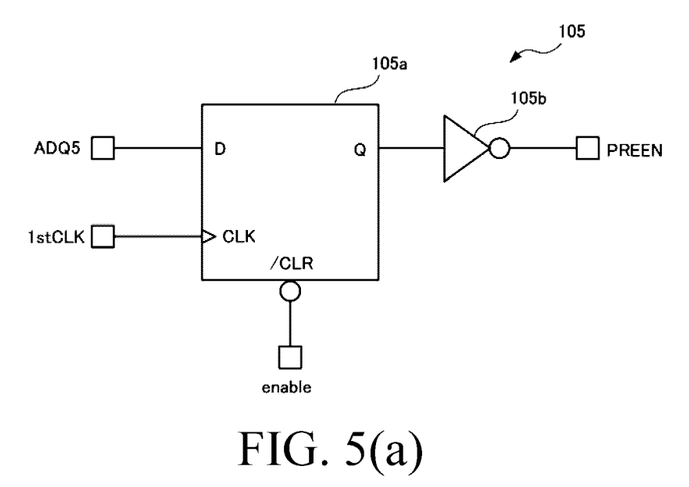
FIG. 5(a) is a schematic diagram illustrating a configuration example of a precharge signal generation unit.

FIG. 5(*a*) illustrates the configuration of the precharge signal generation unit 105. The precharge signal generator 105 includes a shift register 105*a* and an inverter 105*b*. The shift register 105*a* latches ADQ5 of the 8-bit signal ADQ[7:0] when the first external clock signal CLK(1stCLK) is input as a clock signal during operation. The inverter 105*b* logically inverts the signal output from the shift register 105*a*, and outputs the logically inverted signal to the precharge control unit 106 and the delay signal generation unit 107 as the precharge enable signal PREEN. In addition, a reset signal enable generated by, for example, another circuit in the control unit 10 is applied to the /CLR terminal of the shift register 105*a*.

The precharge control unit 106 controls the precharge of the word line corresponding to the input row address when the precharge enable signal PREEN indicates that precharge is being performed (when the precharge enable signal PREEN is active (high level)). In this embodiment, when the chip selection signal CS #is active (low level), the precharge control unit 106 generates the precharge signal PRE according to the precharge enable signal PREEN input from the precharge signal generation unit 105, and provides the generated precharge signal PRE to the row control unit 102. For example, when the precharge enable signal PREEN is active (high level) (when precharging is performed), the precharge control unit 106 makes the precharge signal PRE active (high level), and provides the precharge signal PRE to the row control unit 102. In addition, when the precharge enable signal PREEN is inactive (low level) (when precharging is not performed), the precharge control unit 106 deactivates the precharge signal PRE (low level), and outputs the precharge signal PRE to the row control unit 102.

The delay signal generation unit 107 controls the delay in the second operation less than the initial delay when the precharge enable signal PREEN indicates that precharging is not performed (when the precharge enable signal PREEN is inactive (low level)). set to short delay). In this embodiment, the delay signal generation unit 107 generates the signal NLTNCY based on the precharge enable signal PREEN input from the precharge signal generation unit 105, and outputs the generated signal NLTNCY to the delay counter 103. In addition, in the present embodiment, the delay signal generation unit 107 is an example of the "delay control unit" of the present invention.

Figure 5B:
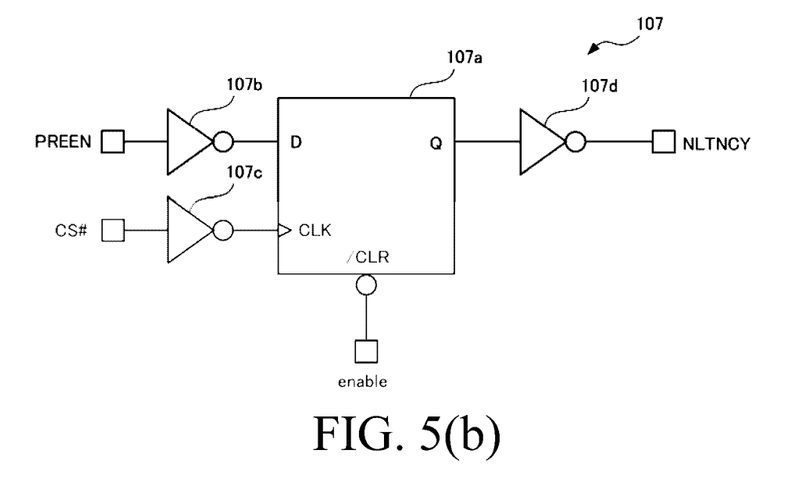
FIG. 5(b) is a schematic diagram illustrating a configuration example of a delay signal generation unit.

FIG. 5(*b*) illustrates the configuration of the delay signal generation unit 107. The delay signal generation unit 107 includes a shift register 107*a* and inverters 107*b*, 107*c* and 107*d*. When the chip select signal CS #logically inverted by the inverter 107*c* is input as the clock signal, the shift register 107*a* outputs the precharge enable signal PREEN which is logically inverted by the inverter 107*b*. The inverter 107*d* logically inverts the signal output from the shift register 107*a*, and outputs the logically inverted signal to the delay counter 103 as the signal NLTNCY. In addition, a reset signal enable generated by, for example, another circuit in the control unit 10 is applied to the /CLR terminal of the shift register 107*a*.

The control unit 10 configured as described above is arranged in a state in which the word line accessed in the previous operation (first operation) is activated (in a state in which the precharge enable signal PREEN is inactive (low level)). Next, when the word line is accessed in the following operation (second operation), the row address RA in the address input in the following operation is deactivated. By only activating the column address CA, the delay in the following operation is less than the initial delay.

Figure 6B:
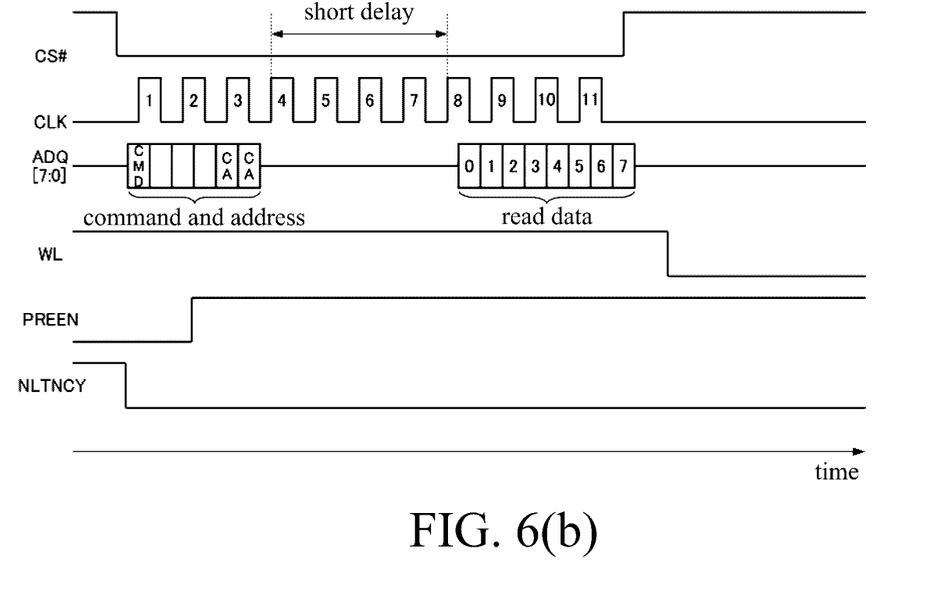
FIG. 6(b) is a time chart illustrating an example of the timing of the signals in the pSRAM in the state where the short delay is set when a read command is input.

FIG. 6(*a*) is a timing chart illustrating an example of the timing of the signals in the pSRAM in the state where the initial delay is set when a read command is input, and FIG. 6(*b*) is a timing chart of an example of the timing of the signals in the pSRAM in the state where the short delay is set when a read command is input.

First, the operation shown in FIG. 6(*a*) will be described. It is assumed that the precharge enable signal PREEN is active (high level) (precharge is performed) and the signal NLTNCY is active (high level) (delay in the read operation is the initial delay) before the read operation (the first operation) starts.

By activating the chip selection signal CS #(low level), after the read operation starts, when the command CMD is input in synchronization with the external clock signal CLK, the precharge signal generating unit 105 generates a precharge enable signal PREEN according to the command CMD. In addition, it is assumed that the command CMD is a read command without precharge (the value of ADQ5 is 1), the precharge signal generation unit 105 deactivates the precharge enable signal PREEN (low level) and provides the precharge enable signal PREEN to the precharge control unit 106 and the delay signal generation unit 107.

On the other hand, the shift register 107*a* of the delay signal generation unit 107 is in a state where the signal input to the clock terminal (the logic inversion signal of the chip select signal CS #) is already active (high level). The logic inversion signal of the precharge enable signal PREEN output from the precharge signal generation unit 105 is not latched. Therefore, the delay signal generation unit 107 outputs the active (high level) signal NLTNCY to the delay counter 103.

When the active (high level) signal NLTNCY is input, the delay counter 103 determines that the delay in the read operation is an initial delay, and counts the number of pulses of the external clock signal CLK until it reaches a value corresponding to the initial delay. In addition, the row control unit 102 activates the word line corresponding to the input row address RA during the initial delay period.

Next, when the number of pulses of the external clock signal CLK reaches the value corresponding to the initial delay, the delay counter 103 outputs the signal CAS to the column control unit 104, and the data in the memory cells corresponding to the input row address RA and the input column address CA may be read. In addition, the read operation is ended by deactivating the chip select signal CS #(high level). Moreover, in this read operation, since a read command without precharge (the value of ADQ5 is 1) is input, the precharge of the word line corresponding to the input row address RA is not performed, so that the word line is maintained in the activated state.

Next, the operation shown in FIG. 6(*b*) will be described. It is assumed that the read operation (second operation) shown in FIG. 6(*b*) is performed after the read operation shown in FIG. 6(*a*). Before the read operation starts, the precharge enable signal PREEN is inactive (low level), and the signal NLTNCY is active (high level). In addition, since the input of the row address RA becomes inactive in the subsequent read operation, the row address RA is omitted from the inputted row addresses.

By activating the chip selection signal CS #(low level), after the read operation starts, the precharge signal generation unit 105 generates a precharge enable signal PREEN according to the command CMD when the command CMD is input in synchronization with the external clock signal CLK. It is assumed that the command CMD is a read command with precharge (the value of ADQ5 is 0). The precharge signal generation unit 105 enables the precharge enable signal PREEN and outputs the precharge enable signal PREEN to the precharge control unit 106 and the delay signal generation unit 107.

On the other hand, the shift register 107*a* of the delay signal generation unit 107 latches the logic inversion signal of the precharge enable signal PREEN when the chip selection signal CS #is active (low level). In addition, when the chip selection signal CS #is active (low level), the precharge enable signal PREEN is at the low level, the logic inversion signal of the precharge enable signal PREEN is at the high level, and the delay signal generation unit 107 outputs the inactive signal NLTNCY(low level) to the delay counter 103.

When the inactive (low level) signal NLTNCY is input, the delay counter 103 determines that the delay in the read operation is a short delay, and counts the number of pulses of the external clock signal CLK until the value corresponding to the short delay is reached.

Next, when the number of pulses of the external clock signal CLK reaches the value corresponding to the short delay, the delay counter 103 outputs the signal CAS to the column control unit 104, and the data in the memory cell of the input column address CA corresponding to the read operation (second operation) may be read. In addition, the read operation is ended by deactivating the chip select signal CS #(high level). In addition, in the following read operation (the second operation), since the read command with precharge (the value of ADQ5 is 0) is input, the word line corresponding to the row address RA input in the first operation is precharged.

Therefore, when a specific command (a read command or a write command without precharge) is input in the previous read operation (the first operation), the following read operation (the second operation) may be delayed less than the initial delay. Therefore, since the time of the subsequent read operation may be shortened, the data transfer speed in the subsequent read operation can be improved.

Second Embodiment

In the pSRAM of this embodiment, when a specific command is input in the first operation, the delay in the second operation is less than the initial delay, which is the same as in the first implementation. However, the specific command includes a register write command, which is different from the first embodiment.

Figure 7:
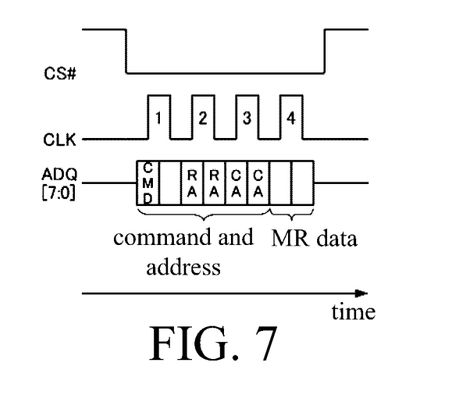
FIG. 7 is a timing chart illustrating an example of the timing of a signal when a register write command is input to the pSRAM in accordance with a second embodiment of the present invention.

As shown in FIG. 7, the register write command includes a command, an address, and data written to a mode register (MR). The MR data includes more than one bit information indicating whether to precharge. In addition, the register write command is as described in the first embodiment that ADQ6 of the 8-bit signal ADQ[7:0] is set to 1 at the first rising edge of the first external clock signal CLK during operation.

The precharge signal generation unit 105 of the control unit 10 obtains the information about the precharge for writing the mode register when the register write command is input. Next, the precharge signal generation unit 105 activates the precharge enable signal PREEN (high level) when the information indicating to precharge is written to the mode register, and outputs the precharge enable signal PREEN to the precharge control unit 106 and the delay signal generation unit 107. In addition, when the precharge signal generation unit 105 writes the information indicating not to precharge to the mode register, the precharge signal generation unit 105 deactivates the precharge enable signal PREEN (low level) and outputs the precharge enable signal PREEN to the precharge control unit 106 and the delay signal generation unit 107.

In the case where the register write command is written in the first operation, the delay signal generation unit 107 of the control unit 10 latches the precharge enable signal PREEN and outputs the latched signal to the delay counter 103 as the signal NLTNCY when the second operation (a read or write operation) following the first operation is completed (the rising edge of the chip select signal CS #).

Figure 8:
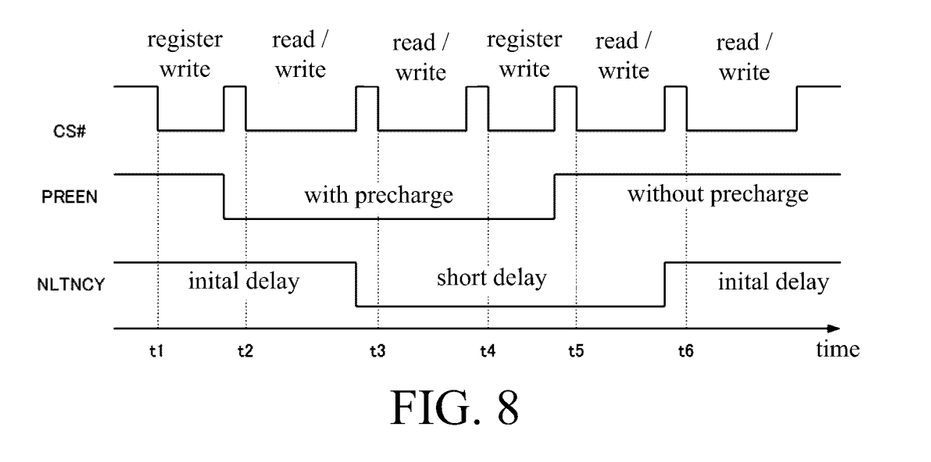
FIG. 8 is a timing chart illustrating an example of the timing of the signals in the pSRAM in accordance with the second embodiment of the present invention.

FIG. 8 is a timing chart showing an example of the timing of the signals in the pSRAM of the present embodiment. In addition, as in the first embodiment, it is assumed that the same column address is accessed in each operation.

In the sequence before the timing t1, the precharge enable signal PREEN is active (high level) (precharge is performed), and the signal NLTNCY is active (high level) (the delay is the initial delay in the read operation) will be described as an example.

When a register write command without precharge is input at the timing t1, the precharge signal generation unit 105 deactivates the precharge enable signal PREEN (low level) and outputs the precharge enable signal PREEN to the precharge control unit 106 and the delay signal generation unit 107 after referring to the information about precharge written in the mode register. In addition, since it is not the timing of latching the precharge enable signal PREEN, the delay signal generating unit 107 outputs the active signal NLTNCY (high level) to the delay counter 103.

When the read operation or the write operation starts at the timing t2, the delay counter 103 sets the delay in the operation as the initial delay according to the active signal NLTNCY (high level). Then, the delay signal generation unit 107 latches the inactive (low level) precharge enable signal PREEN by deactivating the chip selection signal CS #(high level) and outputs the inactive signal NLTNCY(low level) to the delay counter 103 when the read or write operation completes.

When the read operation or the write operation starts at the timing t3, the delay counter 103 sets the delay in operation to be a short delay according to the inactive signal NLTNCY (low level). Therefore, the period for the read or write operation becomes less than the previous read or write operation.

When a register write command with precharge is input at the timing t4, the precharge signal generation unit 105 makes the precharge enable signal PREEN active (high level) and outputs the precharge enable signal PREEN to the precharge control unit 106 and the delay signal generation unit 107 after referring to the information about precharge of the mode register. In addition, since it is not the timing of latching the precharge enable signal PREEN, the delay signal generating unit 107 outputs the inactive signal NLTNCY (low level) to the delay counter 103.

When the read or write operation begins at the timing t5, the delay counter 103 sets the delay in operation to be a short delay according to the inactive signal NLTNCY (low level). Then, when the read or write operation is completed by deactivating the chip selection signal CS #(high level), the delay signal generation unit 107 latches the active precharge enable signal PREEN and outputs the active signal NLTNCY (high level) to the delay counter 103.

When the read or write operation starts at the timing t6, the delay counter 103 sets the delay in operation as the initial delay according to the active signal NLTNCY (high level).

Therefore, according to the register write command input in a specific operation (first operation), the delay in the subsequent operation (second operation) may be set as an initial delay or a short delay.

Third Embodiment

In the present embodiment, when the control unit 10 satisfies the specific condition, the delay in the second operation is set to be less than the initial delay, which is the same as in the above-described embodiments. However, the specific condition includes inputting the same row address RA in the first operation and the second operation, which is different from the above-mentioned embodiments.

The control unit 10 is configured to control the delay in each successive operation posterior to the second operation to be less than the initial delay during the period in which the same row address RA is input in each successive operation when a specific condition is satisfied.

Figure 9:
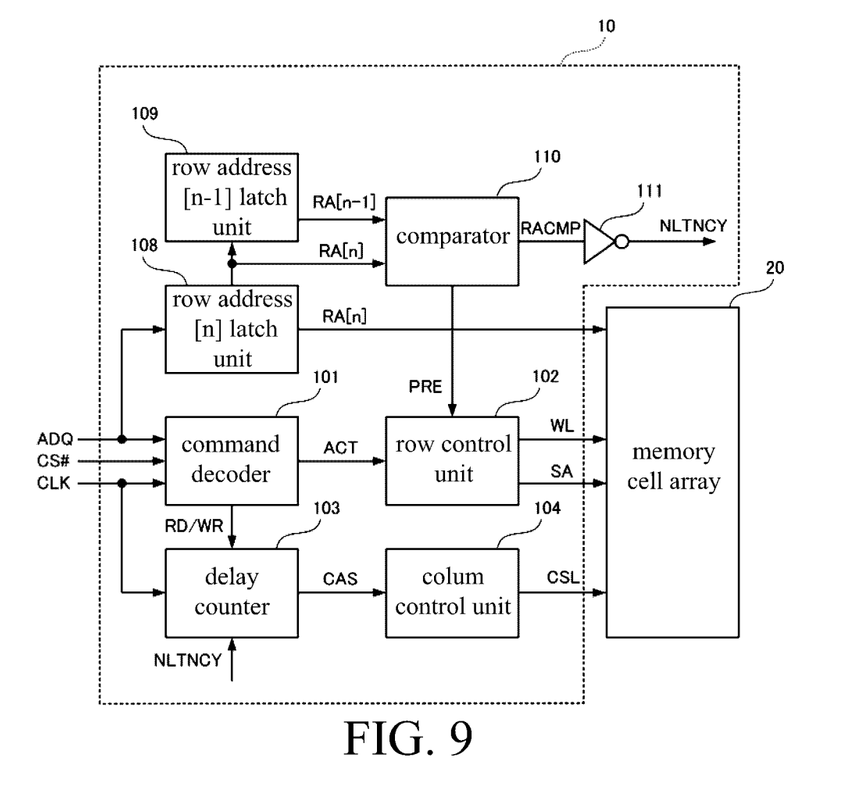
FIG. 9 is a block diagram illustrating a configuration example of a pSRAM in accordance with a third embodiment of the present invention.

FIG. 9 is a block diagram showing a configuration example of a pSRAM according to this embodiment. The control unit 10 includes: an instruction decoder 101; a row control unit 102; a delay counter 103; a column control unit 104; a row address [n] latch unit 108, latching the row address RA input in the n-th (n is greater than 1) operation; a column address [n−1] latch unit 109 latching the row address RA input in the (n−1)-th operation; a comparator 110, and an inverter 111. The configuration of the command decoder 101, the row control unit 102, the delay counter 103, and the column control unit 104 is the same as that in the first embodiment.

The row address [n] latch section 108 latches the row address RA input in the operation during every operation.

Next, the row address [n] latch unit 108 outputs a signal RA[n] indicating the value of the latched row address RA to the row address [n−1] latch unit 109, the comparator 110, and the memory cell array 20.

The row address [n−1] latch unit 109 latches the input signal RA[n] and the signal RA[n−1] input as the signal RA[n] in the previous operation every time when the row address [n−1] latch unit 109 receives the input signal RA[n] from the column address [n] latch unit 108. Next, the row address [n−1] latch unit 109 outputs the signal RA[n−1] to the comparator 110.

The comparator 110 compares the value of the signal RA[n] input from the column address [n] latch 108 with the value of the signal RA[n−1] input from the column address [n−1] latch 109. Then, when the two values are equal, the comparator 110 makes the signal RACMP indicating the comparison result active (high level) and outputs the signal RACMP to the inverter 111, so that the precharge signal PRE is inactive (low level) and output to the row control unit 102. On the other hand, when the two values are different, the comparator 110 deactivates the signal RACMP (low level) indicating the comparison result and outputs the signal RACMP to the inverter 111, so that the precharge signal PRE is active (high level) and output to the row control unit 102.

The inverter 111 logically inverts the signal RACMP output from the comparator 110, and outputs the logically inverted signal to the delay counter 103 as the signal NLTNCY. That is, the inverter 111 controls the delay in the n-th operation less than the initial delay (set as a short delay) by outputting the inactive (low level) signal NLTNCY to the delay counter 103 when the signal RACMP indicating the comparison result that the row address (the value of the signal RA[n]) input in the n-th operation and the row address (signal RA) input in the n−1-th operation are the same row address (when the signal RACMP is active (high level)). In addition, in this embodiment, the inverter 111 is an example of the "delay control unit" of the present invention.

Figure 10:
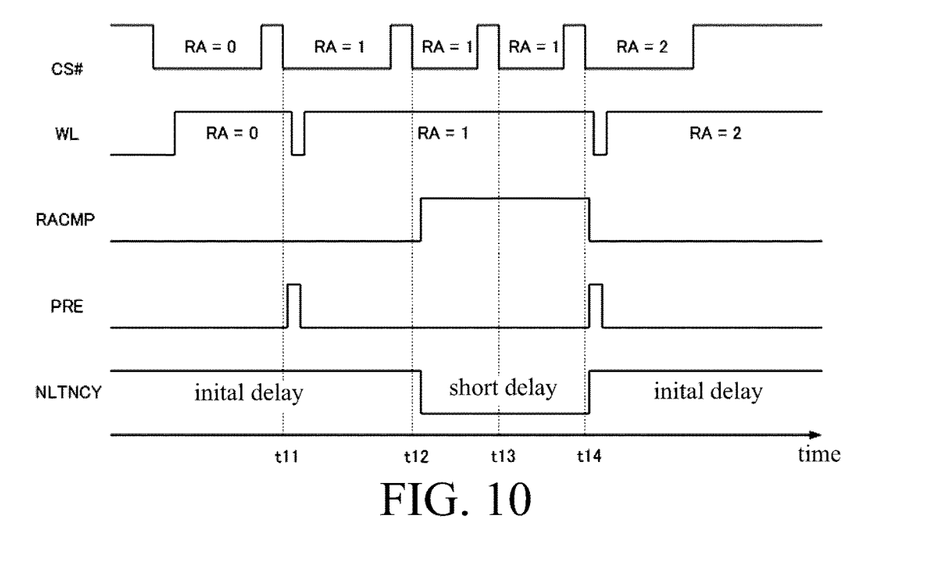
FIG. 10 is a timing chart illustrating an example of the timing of the signals in the pSRAM in accordance with a third embodiment of the present invention.

FIG. 10 is a timing chart illustrating an example of the timing of the signals in the pSRAM of the present embodiment. It is assumed that the precharge signal PRE is inactive (low level)), and the signal NLTNCY is active (high level) in a case where the row address RA having a value of 0 is accessed in the operation before the timing t11 and the word line of the row address RA is activated.

When the next operation starts at the timing t11 and the row address RA having a value of 1 is input, the row address [n] latch unit 108 outputs a signal RA[n] having a value of 1 to the row address [n−1] latch unit 109, the comparator 110, and the memory cell array 20. On the other hand, when the signal RA[n] having the value of 1 is input, the row address [n−1] latch unit 109 outputs the signal [n−1] having the value of 0 to the comparator 110.

The comparator 110 compares the value of the signal RA[n] with the value of the signal RA[n−1]. Because the two values are different, the signal RACMP is inactive (low level) and output to the inverter 111 so that the precharge signal PRE is active (high level) and output to the row control unit 102. At this time, the row control unit 102 precharges the word line corresponding to the row address RA input in the previous operation (the word line corresponding to the row address RA having a value of 0), and activates the word line corresponding to the row address RA having a value of 1.

In addition, the delay counter 103 sets the delay in operation to be the initial delay according to the active (high level) signal NLTNCY. In addition, after the operation is completed, the word line corresponding to the row address RA having a value of 1 is maintained in the active state.

When the next operation starts at the timing t12 and the row address RA having a value of 1 is input, the row address [n] latch 108 outputs a signal RA[n] having a value of 1 to the row address [n−1] latch unit 109, the comparator 110, and the memory cell array 20. On the other hand, when the signal RA[n] having the value of 1 is input, the row address [n−1] latch unit 109 outputs the signal [n−1] having the value of 1 to the comparator 110.

The comparator 110 compares the value of the signal RA[n] with the value of the signal RA[n−1]. Since the two values are equal, the signal RACMP is activated (high level) and output to the inverter 111, so that the pre-charge signal PRE is inactive (low level) and output to the row control unit 102.

In addition, the delay counter 103 sets the delay in the operation to a short delay according to the inactive (low level) signal NLTNCY, and the period of the operation becomes less than that of the previous operation.

When the next operation starts at the timing t13 and a row address RA having a value of 1 is input, since the value of the input row address RA is equal to the value of row address RA input in the previous operation, the same operation as the previous operation is performed, and the delay in operation is also set to a short delay.

The next operation starts at the timing t14. When the row address RA having the value of 2 is input, the row address [n] latch unit 108 outputs the signal RA[n] having a value of 2 to the row address [n−1] latch unit 109, the comparator 110, and the memory cell array 20. On the other hand, when the signal RA[n] having the value of 2 is input, the row address [n−1] latch unit 109 outputs the signal [n−1] having the value of 1 to the comparator 110.

The comparator 110 compares the value of the signal RA[n] with the value of the signal RA[n−1]. Since the two values are different, the signal RACMP is inactive (low level) and output to the inverter 111, so that the precharge signal PRE is active (high level) and output to the row control unit 102. At this time, the row control unit 102 precharges the word line corresponding to the row address RA input in the previous operation (the word line corresponding to the row address RA having a value of 1), and activates the word line corresponding to the row address RA having a value of 2.

In addition, the delay counter 103 sets the delay in operation to be the initial delay according to the active (high level) signal NLTNCY. In addition, after the operation is completed, the word line corresponding to the row address RA having the value of 2 is maintained in the active state.

As described above, in the subsequent operation (second operation), when accessing the same row address RA as the previous operation (first operation), the delay in the subsequent operation may be set to be less than the initial delay. In addition, in each successive operation after the subsequent operation (second operation), while the same row address RA as the previous operation (first operation) is input, the delay of each successive operation after the subsequent operation may be set to be less than the initial delay.

Figure 11A:
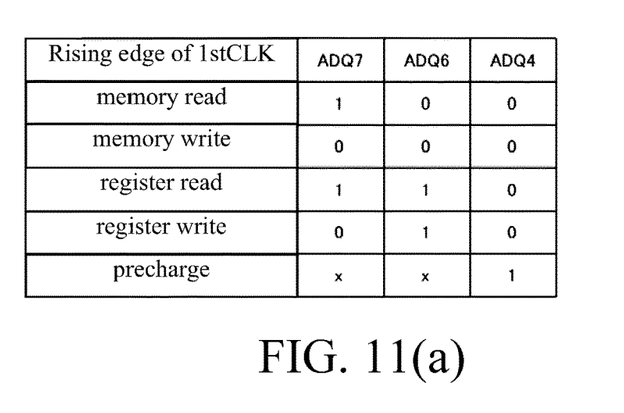
FIG. 11(a) is a schematic diagram illustrating an example of the bit allocation of the command.

Since it is configured to maintain the word line in the active state after the operation is completed, the command CMD to precharge the word line is set. FIG. 11(a) shows an example of the data structure of the command, the command CMD consists of 3 bits that are ADQ7, ADQ6, and ADQ4 of the 8-bit signal ADQ[7:0] inputted at the first rising edge of the external clock signal CLK during operation. The contents of ADQ 7 and ADQ 6 are the same as those in the first embodiment.

Figure 11B:
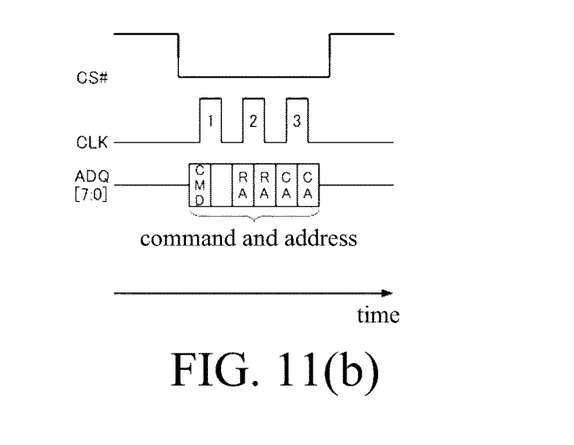
FIG. 11(b) is a time chart illustrating an example of the timing of the signal when the command is input.

ADQ4 is a bit configured to indicate whether to precharging the word line corresponding to the row address RA input in the previous operation. For example, when the value of ADQ4 is 1, it is precharged. In addition, when a command CMD for precharging a word line is input, as shown in FIG. 11(b), only a command and an address are input, and data is not input.

Fourth Embodiment

In the pSRAM of this embodiment, the control unit 10 sets the delay in the second operation to be less than the initial delay when certain conditions are satisfied, which is the same as in the above-mentioned embodiments. However, the specific conditions includes an error is detected in the input written data in the first operation, which is different from in the above-mentioned implementations.

Figure 12:
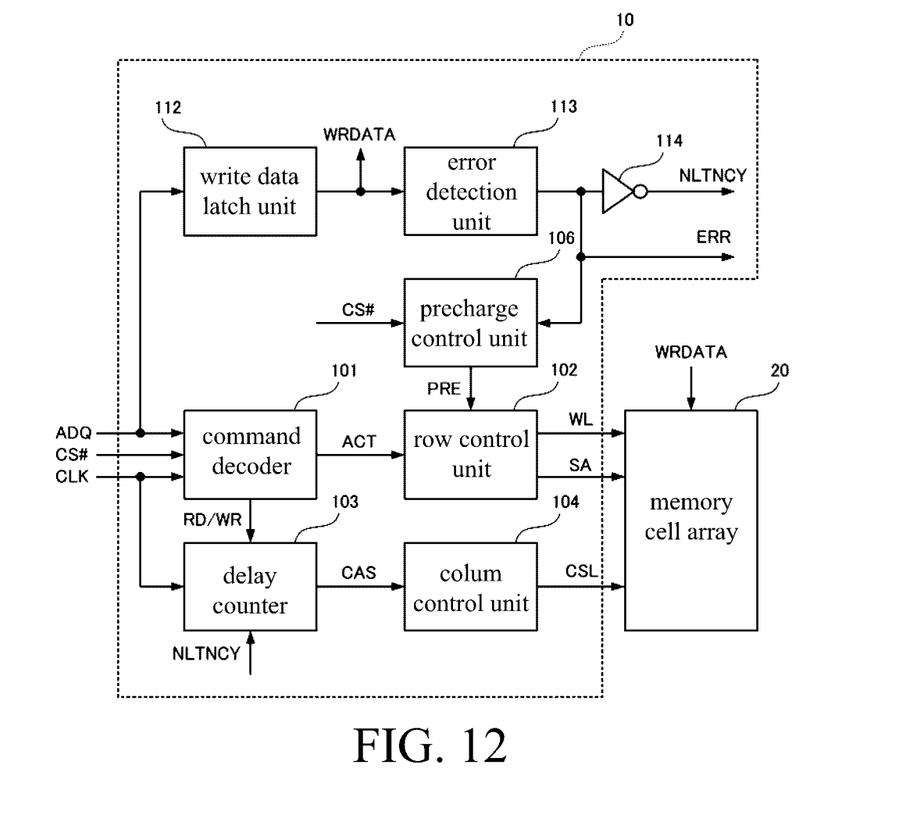
FIG. 12 is a block diagram illustrating a configuration example of a pSRAM in accordance with a fourth embodiment of the present invention.

FIG. 12 is a block diagram illustrating a configuration example of a pSRAM in accordance with this embodiment. The control unit 10 includes an instruction decoder 101, a row control unit 102, a delay counter 103, a column control unit 104, a precharge control unit 106, a write data latch unit 112, an error detection unit 113, and an inverter 114. The configurations of the command decoder 101, the row control unit 102, the delay counter 103, and the column control unit 104 are the same as those of the first embodiment.

In a case where the chip selection signal SC #is active (low level), when the signal ERR in an active (high level) state indicating that an error is detected in the write data WRDATA is input from the error detection unit 113, the precharge control unit 106 deactivates the precharge signal PRE (low level) and output the precharge signal PRE to the row control unit 102. On the other hand, the precharge control unit 106 activates the precharge signal PRE (high level) and outputs the precharge signal PRE to the row control unit 102 when the signal ERR in an inactive (low level) state is input from the error detection unit 113 (when no error is detected in the write data WRDATA).

The write data latch unit 112 latches the write data input through the address data terminal, and outputs the latched write data WRDATA to the error detection unit 113 and the memory cell array 20 during each write operation. In this embodiment, the write data input externally is input in a state having check data for error detection (e.g., the parity code or the cyclic redundancy check (CRC) code, etc.).

When the write data WRDATA and the check data are input from the write data latch unit 112, the error detection unit 113 performs error detection on the write data WRDATA by using the check data. When the error detection unit 113 detects that the written data WRDATA contains an error, the signal EER is activated (high level) and output to the inverter 114 and the precharge control unit 106, and output to the outside through the error terminal as well. On the other hand, when the error detection unit 113 detects that the written data WRDATA does not contain an error, the signal EER is deactivated (low level) and output to the inverter 114 and the precharge control unit 106, and output to the outside through the error terminal as well.

The inverter 114 logically inverts the signal EER output from the error detection unit 113, and outputs the logically inverted signal to the delay counter 103 as the signal NLTNCY. That is, the inverter 114 controls the delay in the second operation less than the initial delay (set as a short delay) by outputting the inactive (low level) signal NLTNCY to the delay counter 103 when the error detection unit 113 detects that the written data contains an error (when the signal ERR is active (high level)). In addition, in this embodiment, the inverter 114 is an example of the "delay control unit" of the present invention.

Figure 13A:
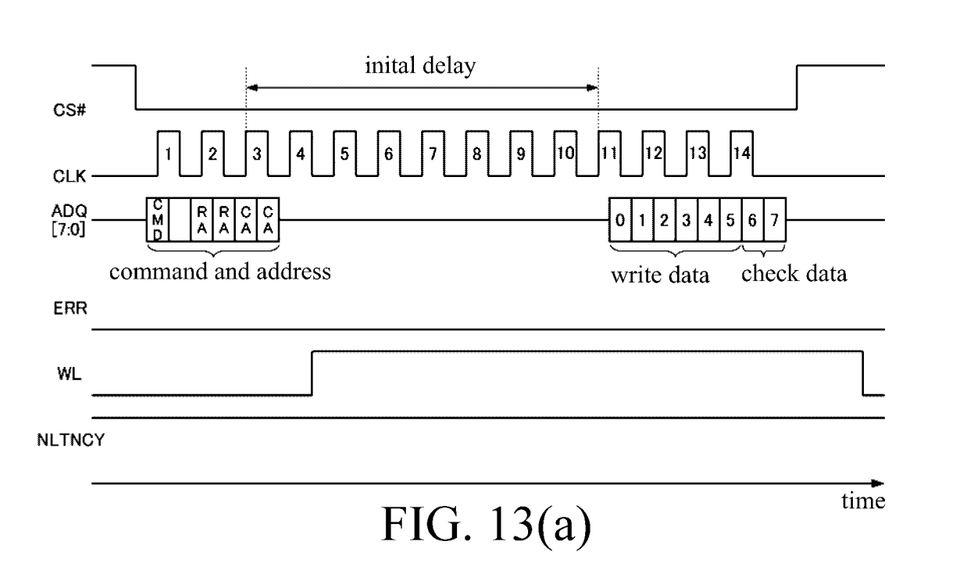
FIG. 13(a) is a timing chart illustrating an example of the timing of the signals in the pSRAM when no error is detected in the write command.
Figure 13B:
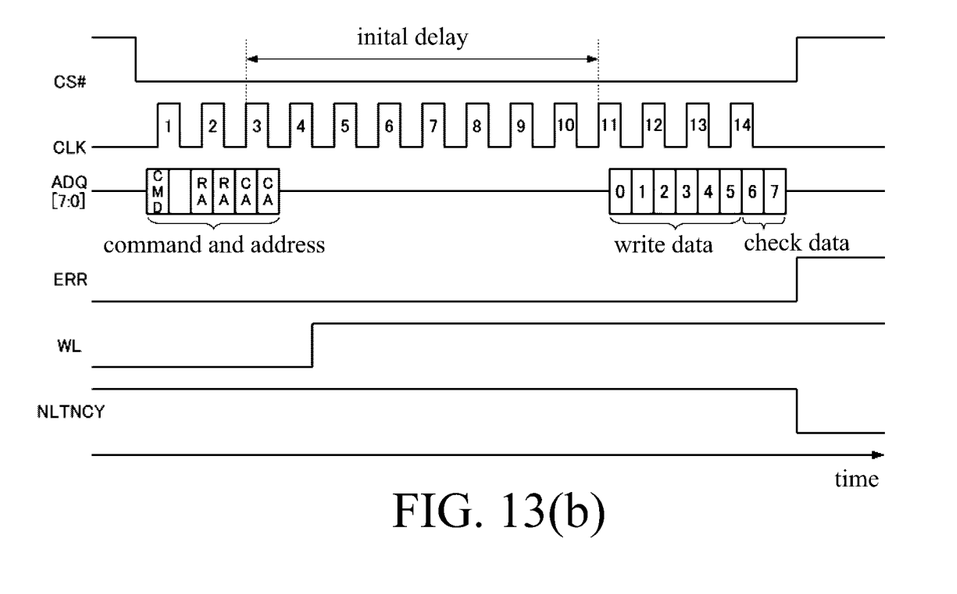
FIG. 13(b) is a timing chart illustrating the pSRAM when an error is detected in the write command.

FIG. 13(a) is a timing chart illustrating an example of the timing of the signals in the pSRAM when no error is detected in a write command, and FIG. 13(b) is a timing diagram of an example of the timing of the signals in the pSRAM when an error detected in a write command. In addition, it is assumed that the same row address is accessed in each operation.

Referring to FIG. 13(a), when the write data WRDATA and the check data are input, the error detection unit 113 detects whether the write data WRDATA contains an error by using the check data. Next, when the error detection unit 113 detects that the write data WRDATA does not contain an error, the signal ERR is deactivated (low level) and output to the inverter 114 and the precharge control unit 106, and the signal ERR is output to the outside through the error terminal as well. At this time, the inverter 114 activates the signal NLTNCY (high level) and outputs the signal NLTNCY to the delay counter 103. Therefore, the delay in the next operation is set to be the initial delay. In addition, the precharge control unit 106 activates the precharge signal PRE (high level) and outputs the precharge signal PRE to the row control unit 102 to precharge the word line after the writing operation is completed.

Referring to FIG. 13(b), when the error detection unit 113 detects that the write data WRDATA contains an error, the precharge signal ERR is activated (high level) and output to the inverter 114 and the precharge control unit 106, and output to the outside through the error terminal as well. At this time, the inverter 114 deactivates the signal NLTNCY (low level) and outputs the signal NLTNCY to the delay counter 103. Therefore, the delay in the next operation is set to be a short delay. In addition, the precharge control unit 106 deactivates the signal PRE (low level) and outputs the signal PRE to the row control unit 102 to maintain the active state of the word line even after the writing operation is completed.

As described above, when an error is detected in the write data WRDATA input in the write operation, the delay in the subsequent operation may be set to be less than the initial delay.

In addition, it is configured as similar to the third embodiment that the active state of the word line is maintained and a command CMD for precharging the word line is set after the operation of writing data WRDATA to detect an error is completed. The command CMD is configured in the same configuration as shown in FIG. 11.

The various embodiments described above are described to facilitate the understanding of the present invention, and the above description is not intended to limit the present invention. Therefore, the elements disclosed in the above-mentioned embodiments are intended to include all design changes or equivalents that fall within the technical scope of the present invention.

In the above embodiments, although the specific command includes a read or write command and a command for instructing whether to precharge a word line as an example, the present invention is not limited thereto. For example, the specific command may only be either a read command or a write command. At this time, in a case where the same row address RA is input in the first operation and the second operation, when a read command or a write command is input in the first operation, the delay in the second operation may be controlled to be less than the initial delay. In addition, the specific command may only be a command for indicating whether to precharge the word line. Furthermore, the specific command may be an arbitrary command configured to set the delay in the subsequent operation (second operation) to a short delay.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A pseudo-static random access memory inputting or outputting data to/from memory cells corresponding to a row address and a column address that are input in a first operation after an initial delay starting from a moment that a command and the row address are input, comprising:
    a control unit, controlling a delay in a second operation less than the initial delay when a specific condition is satisfied, wherein the second operation is executed after the first operation.

2. The pseudo-static random access memory as defined in claim 1,
    wherein the specific condition comprises: inputting a specific command in the first operation, wherein the specific command is configured to make the delay in the second operation less than the initial delay.

3. The pseudo-static random access memory as defined in claim 2,
    wherein the specific command comprises: a read command or a write command that is configured to not precharge a word line corresponding to the row address that has been input.

4. The pseudo-static random access memory as defined in claim 3,
    wherein the control unit further comprises:
    a precharge signal generation unit, generating a precharge enable signal based on the input command, wherein the precharge enable signal indicates whether to precharge the word line corresponding to the row address that is input;
    a precharge control unit, precharging the word line corresponding to the row address that is input when the precharge enable signal indicates for precharging; and
    a delay control unit, controlling the delay in the second operation less than the initial delay when the precharge enable signal indicates for not precharging;
    wherein the precharge signal generation unit is configured to provide the precharge enable signal indicating not to precharge the word line corresponding to the row address to the precharge control unit and the delay control unit when a register writing command indicating not to precharge is input.

5. The pseudo-static random access memory as defined in claim 2,
    wherein the specific command comprises a register writing command.

6. The pseudo-static random access memory as defined in claim 5,
    wherein the control unit further comprises:
    a precharge signal generation unit, generating a precharge enable signal based on the input command, wherein the precharge enable signal indicates whether to precharge the word line corresponding to the row address that is input;
    a precharge control unit, precharging the word line corresponding to the row address that is input when the precharge enable signal indicates to precharge; and
    a delay control unit, controlling the delay in the second operation less than the initial delay when the precharge enable signal indicates not to precharge;
    wherein the precharge signal generation unit is configured to provide the precharge enable signal indicating not to precharge the word line corresponding to the row address to the precharge control unit and the delay control unit when a register writing command indicating not to precharge is input.

7. The pseudo-static random access memory as defined in claim 1, wherein the specific condition comprises inputting an identical row address in the first operation and the second operation.

8. The pseudo-static random access memory as defined in claim 7, wherein when the specific condition is satisfied, the control unit controls a delay in each successive operation less than the initial delay while the identical row address in each successive operation following the second operation is being input.

9. The pseudo-static random access memory as defined in claim 7, wherein the control unit further comprises:
    a comparator, comparing the row address input in an n-th (n is greater than 1) operation with the row address input in an (n−1)-th operation to output a comparison result; and
    a delay control unit, wherein when the comparison result indicates that the row address input in the n-th operation and the row address input in the (n−1)-th operation are identical, a delay in the n-th operation is controlled to be less than the initial delay.

10. The pseudo-static random access memory as defined in claim 1, wherein the specific condition comprises: an error has been detected in written data input in the first operation.

11. The pseudo-static random access memory as defined in claim 10, wherein the control unit further comprises:
    an error detection unit, detecting whether the written data input in the first operation has an error; and
    a delay control unit, controlling a delay in the second operation to be less than the initial delay when it is detected that the written data input in the first operation has an error.

12. The pseudo-static random access memory as defined in claim 1, wherein the pseudo-static random access memory is one of the following:

(i) a pseudo-static random access memory synchronous with a clock signal to input or output a signal; or
(ii) a pseudo-static random access memory with an address data multiplexing interface.

\* \* \* \* \*